(12) United States Patent
Al Marri

(10) Patent No.: US 10,854,377 B2
(45) Date of Patent: Dec. 1, 2020

(54) ANTENNA COUPLER DEVICE

(71) Applicant: Saqr Majed Bin Saqr Al Marri, Dubai (AE)

(72) Inventor: Saqr Majed Bin Saqr Al Marri, Dubai (AE)

( * ) Notice: Subject to any disclaimer, the term of this patent is extended or adjusted under 35 U.S.C. 154(b) by 317 days.

(21) Appl. No.: 15/830,285

(22) Filed: Dec. 4, 2017

(65) Prior Publication Data

US 2019/0172636 A1    Jun. 6, 2019

(51) Int. Cl.
| | |
|---|---|
| *H01F 29/10* | (2006.01) |
| *H01F 27/02* | (2006.01) |
| *H01F 27/24* | (2006.01) |
| *H03H 7/38* | (2006.01) |
| *H01F 41/02* | (2006.01) |
| *H01F 27/28* | (2006.01) |
| *H01Q 5/335* | (2015.01) |
| *H01Q 1/50* | (2006.01) |

(52) U.S. Cl.
CPC ............. *H01F 29/10* (2013.01); *H01F 27/02* (2013.01); *H01F 27/24* (2013.01); *H01F 27/28* (2013.01); *H01F 41/02* (2013.01); *H01Q 5/335* (2015.01); *H03H 7/38* (2013.01); *H01Q 1/50* (2013.01)

(58) Field of Classification Search
CPC .......... H01F 29/10; H01F 27/02; H01F 27/24; H01F 27/28; H01F 41/02; H01Q 5/335; H03H 7/38
See application file for complete search history.

(56) References Cited

U.S. PATENT DOCUMENTS

| | | | | |
|---|---|---|---|---|
| 3,471,815 A | * | 10/1969 | Grant | ................... H01F 27/008 336/83 |
| 4,458,248 A | * | 7/1984 | Lyasko | .................... H01Q 1/04 343/719 |
| 2015/0048993 A1 | * | 2/2015 | Fedosov | ................ H01Q 9/145 343/861 |

* cited by examiner

*Primary Examiner* — Samuel S Outten
(74) *Attorney, Agent, or Firm* — Hayes Soloway PC

(57) ABSTRACT

There is provided an antenna coupler device, comprising a housing comprising a first housing portion and a second housing portion, the housing extending from a housing first end to a housing second end along a central axis, defining a chamber; coils positioned in a stationary position in proximity of the first housing portion and distant from the second housing portion; a ferrite rod moveable along the central axis within the first and second housing portions; and a ferrite moving and adjusting mechanism for moving and adjusting a position the ferrite rod within the first and second housing portions for tuning a radio communication frequency based on a position of the ferrite rod within the first and second housing portions.

20 Claims, 4 Drawing Sheets

ANTENNA COUPLER DEVICE

FIELD OF THE INVENTION

The present invention relates to the field of radio communications, and more particularly to an antenna coupler device for radio communications.

BACKGROUND OF THE INVENTION

An antenna, used with a transmitter or receiver, is an electrical device which converts electric power into radio waves. During transmission, a radio transmitter supplies electric current to the antenna's terminals, and the antenna radiates the energy from the current as radio waves. The antenna must match the output impedance of the transmitter to assure proper coupling of RF (radio frequency) power. For this reason, a device called an antenna coupler must be used to maximize the power radiated from the antenna.

An antenna coupler is an impedance matching device which maximizes the power transfer by minimizing the mismatch loss. Antenna impedance is the amount of power that is either radiated away or absorbed within the antenna. The coupler device is connected between a radio transmitter (or receiver) and its antenna to improve the power transfer between them by matching the impedance of the radio to the antenna's feedline (the cable that connects the antenna with the radio transmitter or receiver).

The process of antenna tuning is performed to lengthen and shorten antennas electrically to match a desired transmission frequency. An RF (radio frequency) tuner is connected electrically to an antenna to adjust the physical length of the antenna by electrical means. Antenna tuning is done using antenna couplers, tuners, and multicouplers. Antenna couplers and tuners are used to match a single transmitter or receiver to one antenna and antenna multicouplers match more than one transmitter or receiver to an antenna.

The ferrite rod antenna is an RF antenna design very convenient for transistor radio applications or portable broadcast receivers. Ferrite rod antennas are also widely used in wireless applications such as RFID (Radio-frequency identification). The antenna makes use of an iron based magnetic material, ferrite. The antenna construction includes a coil which is wound around a ferrite rod. The high permeability of the ferrite material is what the antenna depends on for operation.

The ferrite rod antenna is tuned to resonance using a variable tuning capacitor which is contained within the radio circuitry. At every instance of a frequency change, the antenna coupler must be tuned until the desired impedance match is obtained. Traditional systems perform this tuning process through the use of motors. Auto tuning an antenna involves using a stepper motor for automated extension and retraction of the coil wire around the ferrite rod in order to adjust the frequency. However involving the use of a motor leads to high initial costs, complicated motor components and controllers, high maintenance and limited lifespan during high intensity uses. Auto tuning consumes more power due to recurrent frequency shifts and the increased number of components cause frequency interference. Also, during the process of coil wire extension and retraction, blocking and wearing away of the coil wire occurs due to obstructions caused by unwanted elements or sand particles.

Accordingly, there exists a need to provide a method of frequency tuning for antenna couplers working in adverse environmental conditions, which overcomes at least a part of the above disadvantages and using lesser components.

SUMMARY OF THE INVENTION

Therefore it is an object of the present invention to provide a method of frequency tuning an antenna using an antenna coupler device for matching desired frequencies.

The present invention involves an antenna coupler device, comprising: a housing comprising a first housing portion and a second housing portion, the housing extending from a housing first end to a housing second end along a central axis, defining a chamber; coils positioned in a stationary position in proximity of the first housing portion and distant from the second housing portion; a ferrite rod moveable along the central axis within the first and second housing portions; and a ferrite moving and adjusting mechanism for moving and adjusting a position the ferrite rod within the first and second housing portions for tuning a frequency based on a position of the ferrite rod within the first and second housing portions.

Another aspect of the present invention describes a ferrite moving and adjusting mechanism comprising a spiral structure defining threads positioned at the second housing portion, wherein the ferrite rod is mounted to the spiral structure in such a manner that a rotation of the second housing portion enables movement of the ferrite rod along the threads of the spiral structure and adjustment of a position of the ferrite rod along the central axis within the first and second housing portions for tuning a radio communication frequency.

In another embodiment, the second housing portion has an internal surface defining an internal wall of the second housing portion, and wherein the spiral structure is affixed to the internal wall of the second housing portion, and wherein the ferrite rod has leg members engaging and moving along the threads of the spiral structure for enabling the movement of the ferrite rod.

In another embodiment, the housing and the spiral structure is made of a non-conductive material.

In another embodiment, the first housing portion has a first housing portion first and second ends and an external surface defining an external wall of the first housing portion wherein the coils are winded around the external surface along the central axis between the first housing first and second ends.

In another embodiment, the coils are copper windings.

In another embodiment, the housing has a cylindrical shape, and the second housing rotates with respect to the first housing portion.

In another embodiment, movement of the ferrite rod inside the first housing portion in direction of the first housing portion first end enables to tune low frequency values and movement of the ferrite rod outside the first housing portion and away of the first housing portion first end enables to tune high frequency values.

In another embodiment, the first housing portion has a first length along the central axis, the second housing portion has a second length along the central axis, and the ferrite rod has a third length along the central axis, wherein the third length is equal or smaller to the first length and second length such that the ferrite rod is entirely positioned within the first housing portion or the second housing portion during frequency tuning.

In another embodiment, the ferrite rod comprises two or more ferrite rods coupled to supporting members for forming a unified structure with the two or more ferrite rods for providing solidity thereto.

In another embodiment, the antenna coupler device is immune to particles and impurities present in a sand desert or other hostile environments such that penetration of the particles and impurities to the coils does not affect operation of the device.

In another embodiment, the coils are exclusively positioned at or in proximity of the first housing portion, and wherein the second housing portion is free of and does not have any coils present therein, winded thereto or in proximity thereof such that high frequency values are achieved when the ferrite rod is entirely positioned within the second housing portion.

Another aspect of the present invention describes a method of manufacturing an antenna coupler device, the method comprising: providing a housing comprising a first housing portion and a second housing portion, the housing extending from a housing first end to a housing second end along a central axis, defining a chamber; positioning coils in a stationary position in proximity of the first housing portion and distant from the second housing portion; providing a spiral structure defining threads positioned at the second housing portion; and providing a ferrite rod moveable along the central axis within the first and second housing portions.

In another embodiment, the housing is a cylindrical housing comprising a peripheral wall having an internal surface and an external surface.

In another embodiment, the housing and the spiral structure is made of a non-conductive material.

In another embodiment, the first housing portion has a first length along the central axis, the second housing portion has a second length along the central axis, and the ferrite rod has a third length along the central axis, wherein the third length is equal or smaller to the first length and second length.

In another embodiment, the coils are affixed to an external surface of the first housing portion and surrounding the first housing portion, and the spiral structure is affixed to an internal wall of the second housing portion.

In another embodiment, the ferrite rod comprises two or more ferrite rods coupled to supporting members for forming a unified structure with the two or more ferrite rods for providing solidity thereto.

In another embodiment, the ferrite rod comprises leg members engaging and moving along the threads of the spiral structure.

Additional advantages, objects, and features of the invention will be set forth in part in the description which follows and in part will become apparent to those having ordinary skill in the art upon examination of the following or may be learned from practice of the invention.

BRIEF DESCRIPTION OF THE DRAWINGS

The subject matter that is regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION OF THE INVENTION

The aspects of the antenna coupler device according to the present invention will be described in conjunction with FIGS. 1-4.

The antenna coupler device according to the present invention provides a solution to tuning of frequency in hostile environmental conditions, such as sand deserts. The antenna coupler device according to the present invention tunes frequency without movement or rotation of the coils which remain in a stationary, fix and immovable position during frequency tuning. This is in order to avoid any issues with the frequency tuning process by the obstruction of the movement or rotation of the coils by particles, such as sand, present in such hostile environmental conditions.

Figure 1:
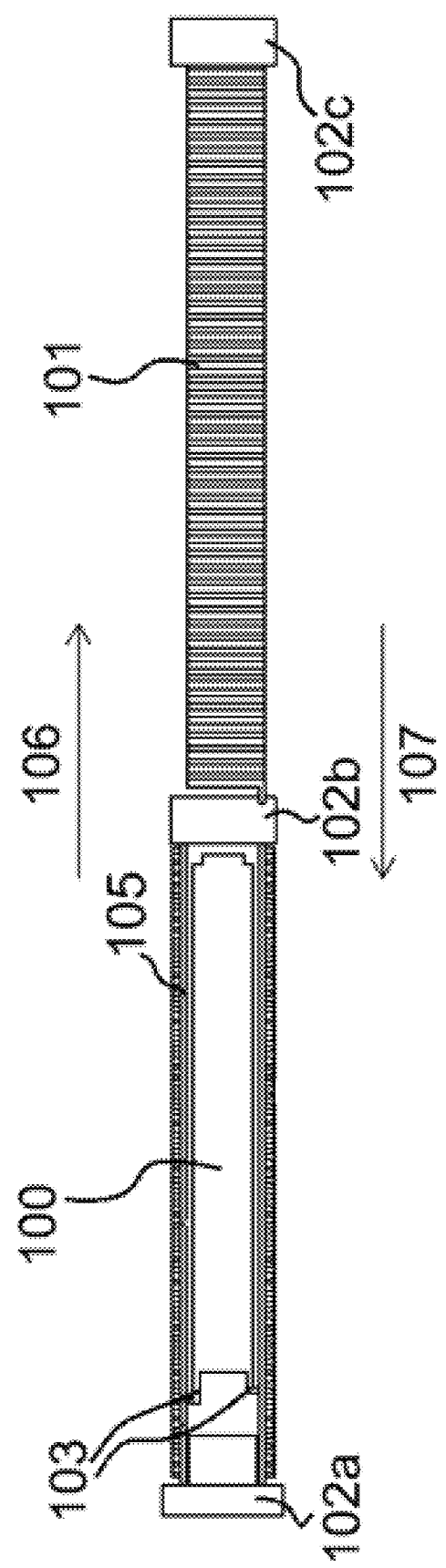
FIG. 1 shows an antenna coupler in accordance with the present invention.

Referring to FIG. 1, in accordance with one embodiment of the invention, the antenna coupler device comprises an elongated hollow cylindrical housing having a first housing portion and a second housing portion. The housing extends along a central axis between a first end and a second end. The first housing portion extends along the central axis between a first housing portion first end and a first housing portion second end. The first housing portion first end corresponds to the first end of the housing. The second housing portion extends along the central axis between a second housing portion first end and a second housing portion second end. The second housing portion second end corresponds to the second end of the housing. The housing has a peripheral wall having an internal surface and an external surface.

The housing is preferably made of non-conductive material 105, such as fiberglass (preferably reinforced fiberglass such as military fiberglass). The antenna coupler device further comprises one or more ferrite rods 100 moveable within the housing through a chamber formed by the first and second housing portions.

In a preferable embodiment of the present invention, the elongated hollow cylindrical housing of the coupler device is made of fiberglass as a single piece. The middle ring 102b is pushed from the second end of the second housing portion to the middle of the coupler device and soldered with the coils 101. In an embodiment, a copper plate is also soldered to the middle ring 102b which is connected to the ring 102a. The copper plate helps to connect RF signals to the coils 101. The antenna coupler device further comprises a first ring 102c at the housing first end, and a second ring 102a at the housing second end which is joined to the fibreglass coupler device using hydraulic force. In another embodiment, the middle ring 102b further comprises a screw hole 104 through which a screw component is inserted and tightened. The screw component inserted through the screw hole 104 aids to secure one or more ferrite rods 100 from moving and causing vibrations that may further lead to alterations in the frequency.

In another embodiment, the first housing portion and the second housing portion are adapted to be mechanically coupled together using a mechanical coupling mechanism (such as a ring 102b) or threads located within the housing portions and adapted to enable a threaded section of one of the housing portion to receive a threaded section of the other housing portion. The first and second housing portions are removably mountable together such as it is possible to mount and demount the housing portions when required (for example for maintenance of the coils and/or the ferrite rods and/or other internal components). Preferably, the second housing portion is rotatable with respect to the first housing portion, where such a rotation is enabled by the mechanical coupling mechanism and allows the movement of the one or more ferrite rods 100 along the central axis within the first and second housing portions.

In another embodiment, the middle ring 102b comprises additional threading to allow a nut and bolt structure to be fixed through the threading, and provide a locking mechanism. This locking mechanism uses the nut and bolt structure to restrict the second housing portion from rotating once a particular frequency has been obtained.

The non-conductive housing material 105 provides isolation and protection to the internal components of the antenna coupler device including the one or more ferrite rods 100 and the coils 101. Use of the non-conductive material for the housing, such as fiberglass, prevents signal interference therefore enhancing the frequency tuning process and the performance of the antenna coupler device.

The antenna coupler device comprises coils 101 positioned at the first housing portion. The coils 101 are preferably made of copper windings and are mounted in proximity of the first housing portion such that resonance can take place when the one or more ferrite rods 100 penetrate through the first housing portion. Preferably, the coils 101 are affixed or mounted in such a manner to be distant from the second housing portion such that it is possible during the frequency tuning process, for the one or more ferrite rods 100 to be entirely located within the first or second housing portion. Preferably, the coils 101 are exclusively mounted or affixed to the first housing portion without any part thereof being mounted or affixed to the second housing portion and/or present in the second housing portion.

In a preferable embodiment of the invention, the coils 101 are winded or mounted or affixed to the external surface of the first housing portion and surrounding the first housing portion from the outside.

In another embodiment, the coils 101 are mounted/affixed (such as glued) to the internal surface of the first housing portion along its central axis between the first housing portion first and second ends. According to this configuration, the coils 101 are positioned inside the first housing portion along the internal surface of the wall of the first housing portion.

The antenna coupler device further comprises one or more ferrite rods 100 moveable within the housing through a chamber formed by the first and second housing portions. Resonance and the frequency tuning process takes place when the one or more rods move through the chamber formed by the first and second housing portions. The one or more ferrite rods 100 has a length which is preferably equal or smaller to the length of the second housing portion such that it is possible for the one or more ferrite rods 100 to be entirely enclosed within the second housing portion away from the coils 101 present inside or in proximity of the first housing portion during frequency tuning. In an embodiment of the invention, the one or more ferrite rods 100, the first housing portion and the second housing portion have suitable dimensions such that the one or more ferrite rods 100 can move within the chamber formed by the first and second housing portions and be partially positioned within the first and second housing portions (based on the frequency tuning desired) or entirely positioned within one or the other of the first and second housing portions to be completely present in one housing portion and completely absent from the other housing portion at a particular time.

In accordance with the present invention, the one or more ferrite rods 100 moves within the first and second housing portions along the central axis of the chamber formed by the first and second housing portions and extends and retracts with respect to the coils 101 present inside or in proximity of the first formed by the first and second housing portion, whereas the coils 101 remain in a stationary, immovable and fixed position. This movement mechanism of the one or more ferrite rods 100 with respect to the coils 101 is of a particular importance which allows frequency tuning of the antenna coupler device without moving or rotating the coils 101 which remain stationary and immovable.

In avoiding movement or rotation of the coils 101, this allows to have a more reliable antenna couple device with a longer life time than traditional antenna coupler devices in which the coils retract and extend with respect to an immovable ferrite rod. This is since movement or rotation of the coils 101 can cause usage and deterioration or damage to these copper windings with time, in addition to being vulnerable to obstruction by impurities and particles, such as sand, present in hostile environments.

The configuration of the antenna coupler device according to this invention therefore reduces considerably the risk of deterioration or damage of the coils 101 with time and any obstruction of the movement or rotation of these. In an embodiment of the invention, the one or more ferrite rods are two ferrite rods 200.

Figure 2:
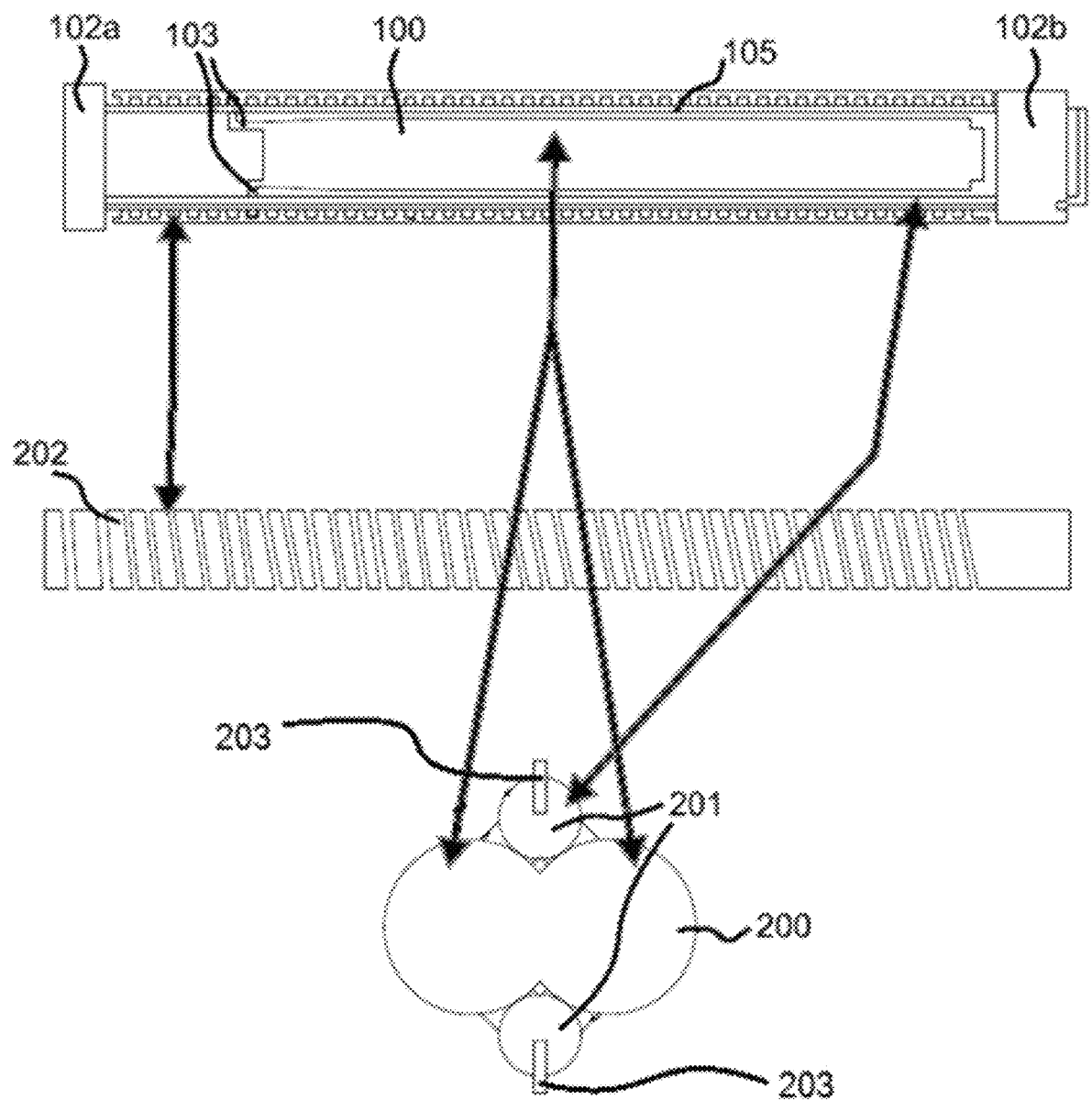
FIG. 2 provides a closer view of a Polyvinyl chloride plastic rod and composition of a ferrite rod used in an antenna coupler structure as shown in FIG. 1.

As illustrated in FIG. 2, in an embodiment of the invention, the antenna coupler device further comprises supporting rods 201 for supporting the ferrite rods. Preferably, the supporting rods 201 are made of a non-conductive material. More preferably, the supporting rods 201 are made of reinforced (such as military) fiberglass. The supporting rods 201 are combined or affixed to the ferrite rods 200 for forming a unified structure which provides more solidity and support to the ferrite rods 200 in order to reduce the risk of damaging or breaking the ferrite rods during operation. The affixation of the supporting rods 201 to the ferrite rods 200 can be achieved using glue or epoxy. Leg members 203 are coupled to one end of the ferrite rod structure comprising supporting rods, where the leg members 203 extend radially with respect to the central axis of the housing for engaging along the threads of the spiral structure 202. The leg members 203 can be made of any suitable material, but preferably stainless steel. Furthermore, use of a fiberglass material for the supporting rods 201 prevents signal interference thus enhancing the frequency tuning process and performance of the antenna coupler device.

Figure 3:
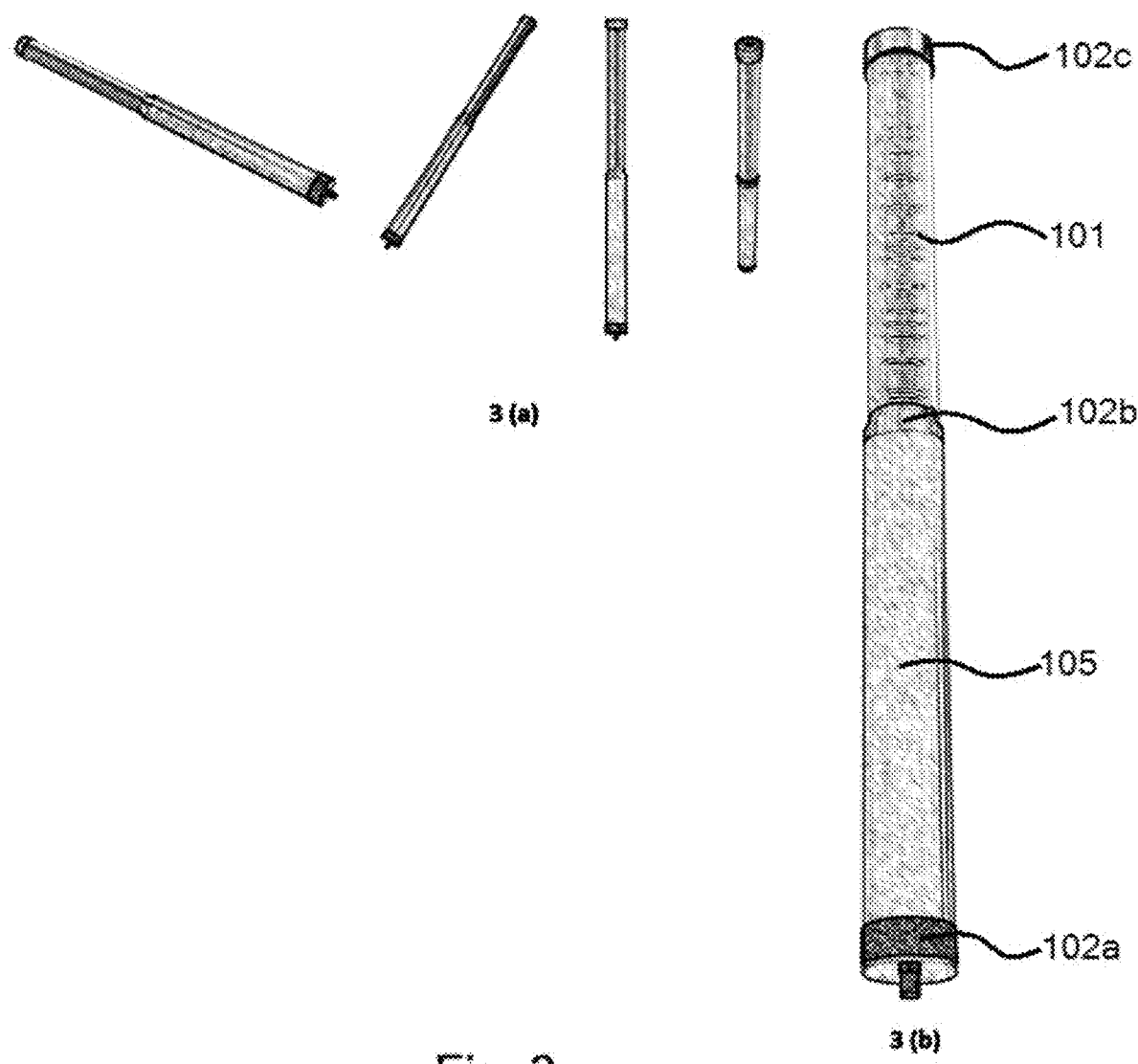
FIG. 3 is a perspective view of an antenna coupler structure implementation of the present invention.

In an embodiment of the invention, the housing first end is adapted to be coupled to an antenna, where the housing second end is adapted to be fixed on a vehicle body in order to be connected to a vehicle antenna coupler or a vehicle's transceiver. FIG. 3 shows a perspective view of the antenna coupler structure implementation in accordance with the invention. FIGS. 3 (*a*) and 3 (*b*) shows different perspective views of the antenna coupler structure implementation in accordance with the present invention. Preferably, the antenna coupler device further comprises a first ring 102c at the housing first end for coupling the antenna coupler device to an antenna, and a second ring 102a at the housing second end for coupling the antenna coupler device to the vehicle antenna coupler.

Figure 4:
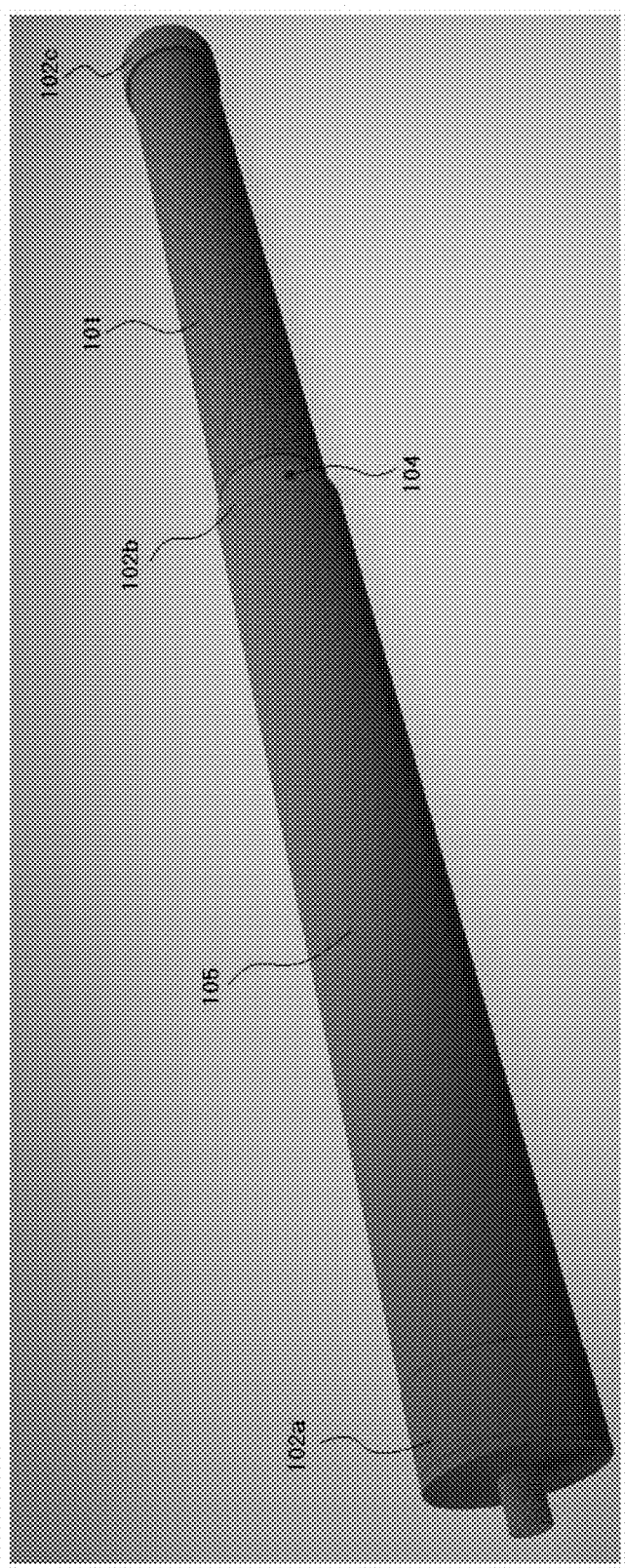
FIG. 4 is a 3D CAD representation of an antenna coupler device, in accordance with the present invention.

FIG. 4 is a 3D CAD representation of an antenna coupler device. As shown in FIG. 4, the middle ring 102b further comprises a screw hole 104 through which a screw component is inserted and tightened. The screw component inserted through the screw hole 104 aids to secure one or more ferrite rods 100 from moving and causing vibrations that may further lead to alterations in the frequency.

In an embodiment of the invention, the antenna coupler device further comprises a ferrite movement or position adjustment mechanism for moving and adjusting the position of the one or more ferrite rods 100 within the first and second housing portions, in order to tune the frequency of the antenna coupler device based on the frequency desired.

In accordance with an embodiment of the invention, the ferrite movement or position adjustment mechanism comprises a spiral structure 202 defining threads affixed using glue or epoxy to the internal surface of the second housing portion between the second housing portion first and second ends. According to this configuration, the one or more ferrite rods 100 is mounted to the spiral structure 202 such that one or more ferrite rods 100 rotate and moves along the threads of the spiral structure 202 downwardly and upwardly along the central axis of the housing when the second housing portion is rotated clockwisely and anti-clockwisely respectively. Preferably, the spiral structure 202 is made of a non-conductive material in order to avoid resonance interference with the coil resonance, such as synthetic plastic polymer material or PVC (Polyvinyl chloride).

In an embodiment of the invention, there is provided leg members 103 coupled to one end of the one or more ferrite rods 100, where the leg members 103 extend radially with respect to the central axis of the housing for engaging and rotating along the threads of the spiral structure 202 resulting in the movement of the one or more ferrite rods 100 along the central axis of the housing through the chamber defined by the first and second housing portions. The leg members 103 can be made of any suitable material, but preferably stainless steel.

The threads of the spiral structure 202 have a suitable configuration (coarse or fine) which defines the resolution of the frequency tuning. The more finer the threads are, the higher the frequency resolution is and vice versa. Each thread of the spiral structure 202 defines a position in which the one or more ferrite rods 100 can be positioned. In the same optic, each thread also defines a specific distance with respect to the coils 101 and therefore a specific frequency.

Rotation of the second housing portion results in an upward and downward movement of the one or more ferrite rods 100 through the coils 101 (wound around the first housing portion) in order to capture lower and higher frequencies respectively as desired. Lower frequency signals are captured by the antenna when the one or more ferrite rods 100 moves in an upward direction and goes in proximity of the coils 101, as depicted by arrow 106, whereas moving the one or more ferrite rods 100 in a downward direction away from the coils 101, shown using arrow 107, results in the antenna capturing higher frequency signals. Frequency tuning involves a process of rotating the second housing portion until a desired frequency is achieved wherein the ferrite rod is positioned at the top, middle or bottom of the antenna coupler structure. Considering an instance wherein the ferrite rod is entirely positioned within the first housing portion, the lowest frequency is achieved by the antenna coupler.

The movement mechanism of the one or more ferrite rods 100 with respect to the coils 101 for frequency tuning, is performed manually. The cylindrically shaped housing of the antenna coupler device supports and enables the rotation of the second housing portion, to capture lower and higher frequencies as desired. Frequency tuning is achieved by rotating the second housing portion, when the antenna coupler device is mounted to the vehicle through the second housing end of the antenna coupler device.

In accordance with another embodiment of the invention, the ferrite movement or position adjustment mechanism comprises a sliding bolt configuration, wherein the sliding bolt is adapted to engage the one or more ferrite rods 101 to move upwardly and downwardly through the second housing portion along the central axis of the housing towards and away from the first housing portion respectively. According to this configuration, the one or more ferrite rods 102 are engaged by the sliding bolt and is pushed upwardly in direction of the first housing portion within the coils 101 and downwardly away from the first housing portion when the sliding bolt slides through the second housing portion. The movement and positioning of the one or more ferrite rods with respect to the coils and therefore frequency tuning is therefore achieved by upward and downward movements of the sliding bolt configuration as desired. An external knob is present on the sliding bolt configuration to facilitate the sliding bolt to move the ferrite rods 102 upwards and downwards. The sliding bolt configuration is moved from ring 102a to the middle ring 102b of the whole elongated hollow piece during frequency tuning. The sliding bolt configuration comprises a screw component so as to lock the sliding bolt in a desired position.

In another embodiment, rotation of the second housing portion for the purpose of frequency tuning is performed automatically by using a motor component along with the vehicle mounted antenna coupler device.

In accordance with yet another aspect of the invention there is further provided a method of manufacturing an antenna coupler device. The method comprises providing a housing comprising a first housing portion and a second housing portion, the housing extending from a housing first end to a housing second end along a central axis and defining a chamber, positioning coils 101 in a stationary position in proximity of the first housing portion and distant from the second housing portion, providing a spiral structure 202 defining threads positioned at the second housing portion and providing a ferrite rod 100 moveable along the central axis within the first and second housing portions.

Many changes, modifications, variations and other uses and applications of the subject invention will become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

The invention claimed is:

1. An antenna coupler device, comprising:
   a housing comprising a first housing portion and a second housing portion, the housing extending from a housing first end to a housing second end along a central axis, defining a chamber;
   coils positioned in a stationary position in proximity of the first housing portion and distant from the second housing portion;
   a ferrite rod moveable along the central axis within the first and second housing portions; and
   a ferrite moving and adjusting mechanism for moving and adjusting a position of the ferrite rod within the first and second housing portions for tuning a frequency based on a position of the ferrite rod within the first and second housing portions, wherein the second housing portion is made of a non-conductive material, is free of and does not have any coils present therein, winded thereto or in proximity thereof and rotates with respect to the first housing portion, and the second housing portion has an internal surface defining an internal wall of the second housing portion, wherein a spiral structure is affixed to the internal wall of the second housing portion, and wherein the ferrite rod has leg members engaging and moving along the threads of the spiral structure for enabling the movement of the ferrite rod.

2. The antenna coupler device of claim 1, wherein the ferrite moving and adjusting mechanism comprises the spiral structure defining threads positioned at the second housing portion, wherein the ferrite rod is mounted to the spiral structure in such a manner that a rotation of the second housing portion enables movement of the ferrite rod along the threads of the spiral structure and adjustment of a position of the ferrite rod along the central axis within the first and second housing portions for tuning a radio communication frequency.

3. The antenna coupler device of claim 2, wherein the spiral structure is made of a non-conductive material.

4. The antenna coupler device of claim 1, wherein the first housing portion has a first housing portion first and second ends and an external surface defining an external wall of the first housing portion wherein the coils are winded around the external surface along the central axis between the first housing first and second ends.

5. The antenna coupler device of claim 4, wherein movement of the ferrite rod inside the first housing portion in the direction of the first housing portion first end is enabled to tune low frequency values and movement of the ferrite rod outside the first housing portion and away of the first housing portion first end is enabled to tune high frequency values.

6. The antenna coupler device of claim 1, wherein the coils are copper windings.

7. The antenna coupler device of claim 1, wherein the housing has a cylindrical shape.

8. The antenna coupler device of claim 1, wherein the first housing portion has a first length along the central axis, the second housing portion has a second length along the central axis, and the ferrite rod has a third length along the central axis, wherein the third length is equal or smaller to the first length and second length such that the ferrite rod is entirely positioned within the first housing portion or the second housing portion during frequency tuning.

9. The antenna coupler device of claim 1, wherein the ferrite rod comprises two or more ferrite rods coupled to supporting members for forming a unified structure with the two or more ferrite rods for providing solidity thereto.

10. The antenna coupler device of claim 1, wherein the antenna coupler device is immune to particles and impurities present in a sand desert or other hostile environments such that penetration of the particles and impurities to the coils does not affect operation of the device.

11. The antenna coupler device of claim 1, wherein the coils are exclusively positioned at or in proximity of the first housing portion, such that high frequency values are achieved when the ferrite rod is entirely positioned within the second housing portion.

12. An antenna coupler device, comprising:
a housing comprising a first housing portion and a second housing portion, the housing extending from a housing first end to a housing second end along a central axis, defining a chamber;
coils positioned in a stationary position in proximity of the first housing portion and distant from the second housing portion;
a ferrite rod moveable along the central axis within the first and second housing portions; and
a ferrite moving and adjusting mechanism for moving and adjusting a position of the ferrite rod within the first and second housing portions for tuning a frequency based on a position of the ferrite rod within the first and second housing portions, wherein the second housing portion is made of a non-conductive material, is free of and does not have any coils present therein, winded thereto or in proximity thereof and rotates with the respect to the first housing portion,
and wherein the first housing portion and the second housing portion are mechanically coupled together using a mechanical coupling mechanism, the mechanical coupling mechanism comprising a first ring, and second ring and a middle ring.

13. The antenna coupler device of claim 12, wherein the mechanical coupling mechanism comprises a plurality of threads located within the housing portions to enable a threaded section of one housing portion to receive a threaded section of the other housing portion.

14. The antenna coupler device of claim 12, wherein the first housing portion has a first housing portion first and second ends and an external surface defining an external wall of the first housing portion wherein the coils are winded around the external surface along the central axis between the first housing first and second ends.

15. The antenna coupler device of claim 14, wherein movement of the ferrite rod inside the first housing portion in the direction of the first housing portion first end is enabled to tune low frequency values and movement of the ferrite rod outside the first housing portion and away of the first housing portion first end is enabled to tune high frequency values.

16. The antenna coupler device of claim 12, wherein the coils are copper windings.

17. The antenna coupler device of claim 12, wherein the first housing portion has a first length along the central axis, the second housing portion has a second length along the central axis, and the ferrite rod has a third length along the central axis, wherein the third length is equal or smaller to the first length and second length such that the ferrite rod is entirely positioned within the first housing portion or the second housing portion during frequency tuning.

18. The antenna coupler device of claim 12, wherein the ferrite rod comprises two or more ferrite rods coupled to supporting members for forming a unified structure with the two or more ferrite rods for providing solidity thereto.

19. The antenna coupler device of claim 12, wherein the antenna coupler device is immune to particles and impurities present in a sand desert or other hostile environments such that penetration of the particles and impurities to the coils does not affect operation of the device.

20. The antenna coupler device of claim 12, wherein the coils are exclusively positioned at or in proximity of the first housing portion, such that high frequency values are achieved when the ferrite rod is entirely positioned within the second housing portion.

* * * * *